US 12,306,257 B2

United States Patent
Munakata et al.

(10) Patent No.: US 12,306,257 B2
(45) Date of Patent: *May 20, 2025

(54) BATTERY PERFORMANCE EVALUATION DEVICE, ELECTRONIC APPARATUS, CHARGER, AND BATTERY PERFORMANCE EVALUATION METHOD

(71) Applicant: Toyo System Co., Ltd., Fukushima (JP)

(72) Inventors: Ichiro Munakata, Fukushima (JP); Shuntaro Igari, Fukushima (JP); Hideki Shoji, Fukushima (JP)

(73) Assignee: TOYO SYSTEM CO., LTD., Fukushima (JP)

( * ) Notice: Subject to any disclaimer, the term of this patent is extended or adjusted under 35 U.S.C. 154(b) by 352 days.

This patent is subject to a terminal disclaimer.

(21) Appl. No.: 17/607,232

(22) PCT Filed: Jan. 5, 2021

(86) PCT No.: PCT/JP2021/000132
§ 371 (c)(1),
(2) Date: Oct. 28, 2021

(87) PCT Pub. No.: WO2021/149482
PCT Pub. Date: Jul. 29, 2021

(65) Prior Publication Data
US 2022/0349944 A1    Nov. 3, 2022

(30) Foreign Application Priority Data
Jan. 20, 2020    (JP) .................................. 2020-007036

(51) Int. Cl.
*H02J 7/00*    (2006.01)
*G01R 31/367*    (2019.01)
(Continued)

(52) U.S. Cl.
CPC ......... *G01R 31/388* (2019.01); *G01R 31/367* (2019.01); *G01R 31/392* (2019.01); *H02J 7/00041* (2020.01)

(58) Field of Classification Search
CPC .. H02J 7/00041; H02J 7/00043; H02J 7/00045; H02J 7/00047
(Continued)

(56) References Cited

U.S. PATENT DOCUMENTS 9,099,759 B2 *  8/2015  Caldwell ........... H01L 31/02021
11,085,971 B2    8/2021  Munakata et al.
(Continued)

FOREIGN PATENT DOCUMENTS

CA    3095272 A1    10/2019
CN    202383263 A    8/2012
(Continued)

OTHER PUBLICATIONS

International Search Report re PCT/JP2021/000132 mailed Mar. 30, 2021 (5 pages).
(Continued)

*Primary Examiner* — Alexis B Pacheco
(74) *Attorney, Agent, or Firm* — Holtz, Holtz & Volek PC (57) ABSTRACT

Provided is a device and the like capable of increasing the convenience in performance evaluation of a secondary battery. A battery performance evaluation device 100 evaluates the performance of a secondary battery 240 installed in an electronic apparatus 200 based on mutual communication between the electronic apparatus 200 and/or a charger 400, to which the electronic apparatus 200 is connected, and the battery performance evaluation device 100. Then, battery performance information Info(D) corresponding to the evaluation result is output to an output interface 204 of the electronic apparatus 200. Thus, a user can ascertain the
(Continued)

performance evaluation result of the secondary battery 240 without the need to take the electronic apparatus 200 or the secondary battery 240 in a specialized institution or the like, thereby increasing the convenience for the user of the electronic apparatus 200.

11 Claims, 9 Drawing Sheets

(51) Int. Cl.
  *G01R 31/388* (2019.01)
  *G01R 31/392* (2019.01)
  *H02J 7/14* (2006.01)
(58) Field of Classification Search
  USPC .......................................................... 320/109
  See application file for complete search history.

(56) References Cited

U.S. PATENT DOCUMENTS

| | | | |
|---|---|---|---|
| 11,097,633 B1 * | 8/2021 | Kohn | H02J 7/00 |
| 2002/0109506 A1 | 8/2002 | Kawakami et al. | |
| 2006/0170397 A1 * | 8/2006 | Srinivasan | G01R 31/392 |
| | | | 320/132 |
| 2011/0084652 A1 * | 4/2011 | Julstrom | H02J 50/12 |
| | | | 320/108 |
| 2011/0121783 A1 * | 5/2011 | Boyles | H02J 7/0013 |
| | | | 320/113 |
| 2013/0069661 A1 * | 3/2013 | Rich | H01M 10/42 |
| | | | 324/433 |
| 2013/0207592 A1 * | 8/2013 | Okada | B60L 58/22 |
| | | | 320/149 |
| 2014/0246905 A1 * | 9/2014 | Yamazaki | H01M 4/587 |
| | | | 307/23 |
| 2018/0183252 A1 | 6/2018 | Kim et al. | |
| 2018/0269540 A1 * | 9/2018 | Tanaka | H02J 7/0068 |
| 2019/0120910 A1 | 4/2019 | Ghantous et al. | |
| 2019/0383878 A1 * | 12/2019 | Coenen | H02J 7/0048 |
| 2021/0028510 A1 | 1/2021 | Munakata et al. | |
| 2022/0091189 A1 * | 3/2022 | Osamura | G01R 31/389 |
| 2022/0120817 A1 | 4/2022 | Okada et al. | |
| 2022/0317191 A1 * | 10/2022 | Munakata | G01R 31/3835 |

FOREIGN PATENT DOCUMENTS

| | | |
|---|---|---|
| CN | 104953191 A | 9/2015 |
| CN | 110383570 A | 10/2019 |
| JP | H09113588 A | 5/1997 |
| JP | 2000019234 A | 1/2000 |
| JP | 2000156248 A | 6/2000 |
| JP | 2002050410 A | 2/2002 |
| JP | 2007187533 A | 7/2007 |
| JP | 2011054542 A | 3/2011 |
| JP | 2011122918 A | 6/2011 |
| JP | 2012220199 A | 11/2012 |
| JP | 2013044598 A | 3/2013 |
| JP | 2013253784 A | 12/2013 |
| JP | 2015135286 A | 7/2015 |
| JP | 5924617 B2 | 5/2016 |
| JP | 2016085062 A | 5/2016 |
| JP | 2018011366 A | 1/2018 |
| TW | 2018011366 A | 4/2013 |
| TW | 201346303 A | 11/2013 |
| WO | 2019187264 A1 | 10/2019 |

OTHER PUBLICATIONS

Extended European Search Report (EESR) dated Feb. 21, 2023, issued in counterpart European Application No. 21743027.1.
Chinese Office Action (and its English translation thereof) dated Sep. 27, 2023, issued in counterpart Chinese Application No. 202180003670.7.
Chinese Office Action (and an English language translation thereof) dated Nov. 22, 2024, issued in counterpart Chinese Application No. 202180003670.7.

* cited by examiner

BATTERY PERFORMANCE EVALUATION DEVICE, ELECTRONIC APPARATUS, CHARGER, AND BATTERY PERFORMANCE EVALUATION METHOD

CROSS-REFERENCE TO RELATED APPLICATIONS

This patent application is a U.S. National Stage filing of, and claims priority to and all advantages of, PCT Patent Application Number PCT/JP2021/000132 filed on Jan. 5, 2021 and Japanese Patent Application No. 2020-007036 filed on Jan. 20, 2020, the contents of both of which are incorporated herein by reference in their entireties.

TECHNICAL FIELD

The present invention relates to a technique of evaluating the performance of a secondary battery such as a lithium-ion battery.

BACKGROUND ART

The internal resistance of a secondary battery is formed by constructing an equivalent circuit with parallel circuits of resistors R and capacitors C connected in multiple stages to discuss changes in the current-voltage behavior waveforms. To describe a transient response waveform of a voltage for several seconds or more, however, the capacitor capacitance value as a time constant element needs to be a value of several 100 F to several 1000 F. Such a value cannot respond to an AC impedance, which is a method of evaluating the AC characteristics of a battery, and to its equivalent circuit model, and therefore it cannot be said that the properties of the battery are reproduced.

An internal resistance is included as a characteristic item of the secondary battery. For example, in a lithium-ion secondary battery (hereinafter, referred to as "LIB secondary battery"), complicated chemical reactions, such as an electrode reaction, an SEI reaction, and an ion diffusion reaction, inside the battery occur intertwined with each other. Therefore, the behavior of the battery voltage is not of the kind where Ohm's law can be applied thereto by treating the internal resistance as a mere DC resistance.

As a method of enhancing the internal resistance of a battery, an AC impedance analysis method based on a frequency response analysis (FRA) has conventionally been well known. Thereby, there has been established a method in which various internal reactions are decomposed into several lime constant elements and interpreted by applying an equivalent circuit model. The second-order behavior of the battery is dominantly affected by the diffusion phenomenon as a Warburg resistance, and therefore how this Warburg resistance can be incorporated as an operation model determines the performance as a model. A dedicated device such as a frequency response analyzer (FRA) is required to perform AC impedance measurements.

CITATION LIST

Patent Literature

Patent Literature 1: Japanese Patent No. 5924617

SUMMARY OF INVENTION

Technical Problem

In practical use, however, the secondary battery is connected to a load, and charging and discharging are repeated. In that case, only voltage, current, and temperature are measured as basic information to know the state of the secondary battery. Under these circumstances, the output voltage of the battery is affected by the internal resistance, and the internal resistance itself changes depending on the temperature conditions or a degree of deterioration of the battery, by which there has been a need for a means for analyzing the characteristics of the battery in actual operation in detail.

Therefore, it is an object of the present invention to provide a device and the like capable of increasing the convenience in performance evaluation of a secondary battery.

Solution to Problem

A battery performance evaluation device according to the present invention is a device for evaluating a performance of a secondary battery installed as a power supply in an electronic apparatus, including: a first control element that causes a current generation device installed in the electronic apparatus or in a charger to generate a current and to input the current into the secondary battery and then recognizes a measured output voltage as a measurement result of a variation mode of a voltage output from the secondary battery, on the basis of communication with the electronic apparatus or the charger, to which the electronic apparatus is connected: a second control element that recognizes a secondary battery model representing current characteristics of the secondary battery on the basis of the communication with the electronic apparatus or the charger and that recognizes a model output voltage as a variation mode of a voltage output from the secondary battery model at the time of input of current to the secondary battery model; and a third control element that evaluates the performance of the secondary battery on the basis of a comparison result of the measured output voltage recognized by the first control element and the model output voltage recognized by the second control element.

A battery performance evaluation method according to the present invention is a method of evaluating a performance of a secondary battery installed as a power supply in an electronic apparatus, including: a first control step of causing a current generation device installed in the electronic apparatus or in a charger to generate a current and to input the current into the secondary battery and then recognizing a measured output voltage as a measurement result of a variation mode of a voltage output from the secondary battery, on the basis of communication with the electronic apparatus or the charger, to which the electronic apparatus is connected, a second control step of recognizing a secondary battery model representing current characteristics of the secondary battery on the basis of the communication with the electronic apparatus or the charger and recognizing a model output voltage as a variation mode of a voltage output from the secondary battery model at the time of input of current to the secondary battery model; and a third control step of evaluating the performance of the secondary battery on the basis of a comparison result of the measured output voltage recognized in the first control step and the model output voltage recognized in the second control step.

An electronic apparatus according to the present invention is an electronic apparatus equipped with a secondary battery as a power supply, including: a first apparatus control element that causes a current generation device installed in or connected to the electronic apparatus to input a current to the secondary battery and causes a first control element constituting a battery performance evaluation device to recognize a measured output voltage as a measurement result of a variation mode of a voltage output from the secondary battery according to the current, on the basis of communication with the battery performance evaluation device, a second apparatus control element that causes a second control element constituting the battery performance evaluation device to recognize a secondary battery model representing current characteristics of the secondary battery on the basis of the communication with the battery performance evaluation device and causes the second control element to recognize the model output voltage as a variation mode of a voltage output from the secondary battery model at the time of input of current to the secondary batters model; and a third apparatus control element that recognizes the performance of the secondary battery evaluated by the battery performance evaluation device on the basis of the communication with the battery performance evaluation device, on the basis of a comparison result of the measured output voltage recognized by the first apparatus control element and the model output voltage recognized by the second apparatus control element, and then outputs information about the performance of the secondary battery to the output interface.

In the electronic apparatus of the present invention, preferably the first apparatus control element causes the first control element to recognize the measured output voltage, and the second apparatus control element causes the second control element to recognize the model output voltage, with a requirement that a first specified operation has been performed through an input interface in the electronic apparatus.

In the electronic apparatus of the present invention, preferably the first apparatus control element causes the first control element to recognize the measured output voltage, and the second apparatus control element causes the second control element to recognize the model output voltage, with a requirement that a power-off operation has been performed through the input interface of the electronic apparatus as the first specified operation.

In the electronic apparatus of the present invention, preferably the first apparatus control element causes the first control element to recognize the measured output voltage, and the second apparatus control element causes the second control element to recognize the model output voltage, with a requirement that the electronic apparatus has been connected to the charger via a connection terminal.

In the electronic apparatus of the present invention, preferably the first apparatus control element causes the first control element to recognize the measured output voltage, and the second apparatus control element causes the second control element to recognize the model output voltage, with a requirement that the electronic apparatus has been connected to the charger equipped with the current generation device as a power supply for charging.

In the electronic apparatus of the present invention, preferably the third apparatus control element causes information about the performance of the secondary battery to be output to the output interface on the basis of the communication with the battery performance evaluation device, with a requirement that a second specified operation has been performed through the input interface of the electronic apparatus.

In the electronic apparatus of the present invention, preferably the third apparatus control element causes information about the performance of the secondary battery to be output to the output interface on the basis of the communication with the battery performance evaluation device, with a requirement that a wake-up operation of the output interface has been performed as the second specified operation through the input interface of the electronic apparatus.

A charger according to the present invention is a charger to which an electronic apparatus equipped with a secondary battery is connected as a power supply, including: a current generation device; a first charger control element that causes the current generation device to input current to the secondary battery of the electronic apparatus connected to the charger and causes a first control element constituting a battery performance evaluation device to recognize a measured output voltage as a measurement result of a variation mode of a voltage output from the secondary battery according to the current, on the basis of communication with the battery performance evaluation device; a second charger control element dial causes a second control element constituting the battery performance evaluation device to recognize a secondary battery model representing current characteristics of the secondary battery on the basis of the communication with the battery performance evaluation device and that causes the second control element to recognize a model output voltage as a variation mode of a voltage output from the secondary battery model at the time of input of virtual current to the secondary battery model; and a third charger control element that recognizes the performance of the secondary battery evaluated by the battery performance evaluation device on the basis of the communication with the battery performance evaluation device, on the basis of a comparison result of the measured output voltage recognized by the first control element and the model output voltage recognized by the second control element, and then outputs information about the performance of the secondary battery to the output interface of the electronic apparatus.

In the charger of the present invention, preferably the first charger control element causes the first control element to recognize the measured output voltage, and the second charger control element causes the second control element to recognize the model output voltage, with a requirement that a first specified operation has been performed through an input interface in the electronic apparatus.

In the charger of the present invention, preferably the first charger control element causes the first control element to recognize the measured output voltage, and the second charger control element causes the second control element to recognize the model output voltage, with a requirement that a power-off operation has been performed through the input interface of the electronic apparatus as the first specified operation.

In the charger of the present invention, preferably the first charger control element causes the first control element to recognize the measured output voltage, and the second charger control element causes the second control element to recognize the model output voltage, with a requirement that the electronic apparatus has been connected to the charger via a connection terminal.

In the charger of the present invention, preferably the third charger control element causes information about the performance of the secondary battery to be output to the output interface on the basis of the communication with the battery performance evaluation device, with a requirement that a second specified operation has been performed through the input interface of the electronic apparatus.

In the charger of the present invention, preferably the third charger control element causes information about the performance of the secondary battery to be output to the output interface on the basis of the communication with the battery performance evaluation device, with a requirement that a wake-up operation of the output interface has been performed as the second specified operation through the input interface of the electronic apparatus.

DESCRIPTION OF EMBODIMENTS

First Embodiment (Configuration of Battery Performance Evaluation System)

Figure 1:
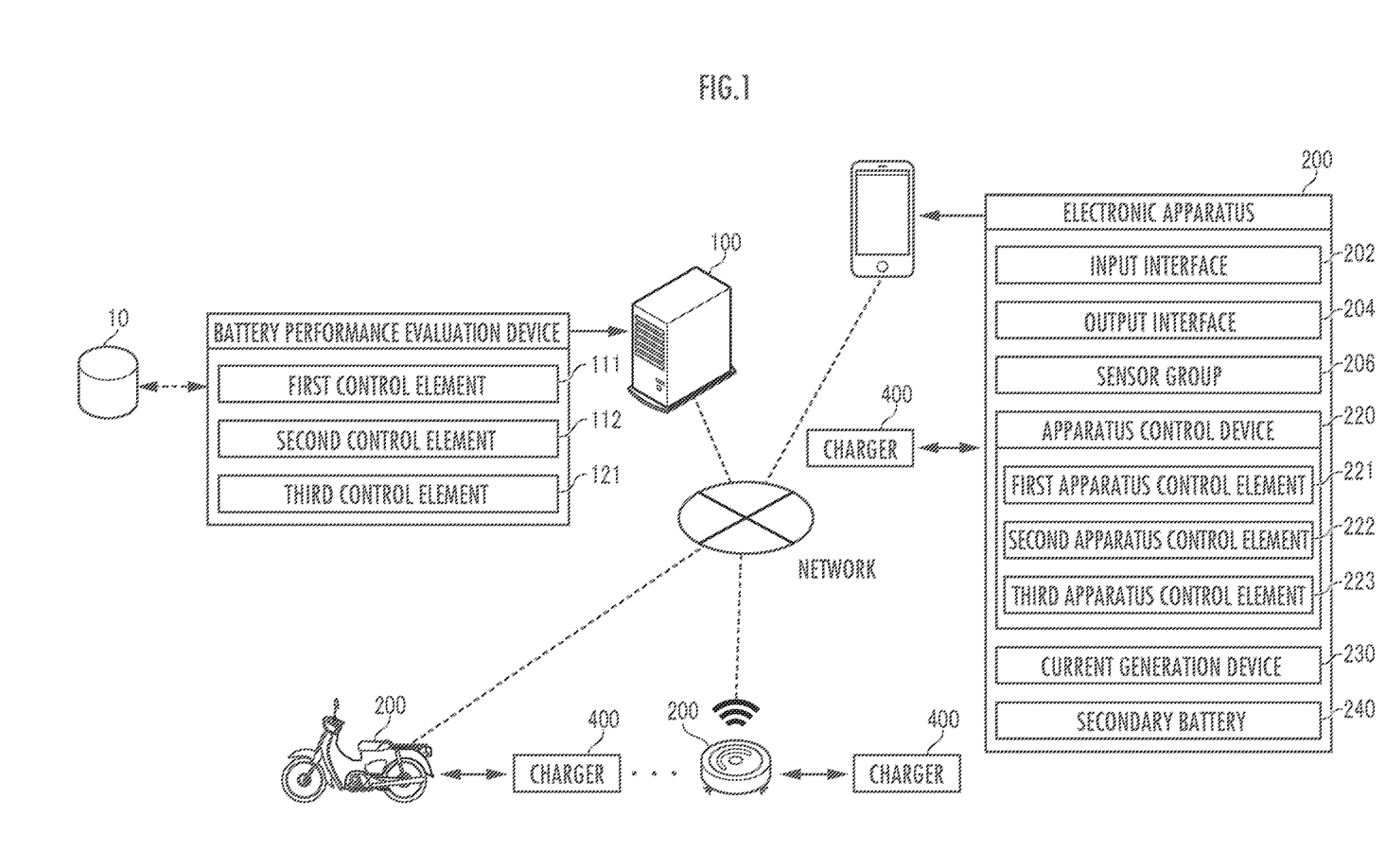
FIG. 1 is an explanatory diagram of the configuration of a battery performance evaluation system as a first embodiment of the present invention.

A battery performance evaluation system as a first embodiment of the present invention illustrated in FIG. 1 includes a battery performance evaluation device 100 and an electronic apparatus 200 capable of mutual communication via a network. The battery performance evaluation device 100 includes one or more servers accessible to a database 10. The battery performance evaluation device 100 evaluates the performance of a secondary battery 240 installed, as a power supply, in the electronic apparatus 200.

The battery performance evaluation device 100 has a first control element 110, a second control element 120, and a third control element 130. Each of the first control element 110, the second control element 120, and the third control element 130 is composed of a processor (arithmetic processing unit), a memory (storage device), an I/O circuit, and the like.

The memory or a storage device separate therefrom stores various data such as measurement results of the voltage response characteristics of the secondary battery 240 to the current (for example, impulse current), as well as programs or software. For example, each of identifiers for identifying the type (determined by standards and specifications) of the secondary battery 240 or of the electronic apparatus 200 equipped therewith is associated with each of secondary battery models before these are stored in the memory. The processor reads the required program and data from the memory and performs arithmetic processing according to the program on the basis of the data, by which arithmetic processing or a task, which is described later, assigned to each of the elements 110, 120, and 130 is performed.

The electronic apparatus 200 has an input interface 202, an output interface 204, a sensor group 206, an apparatus control device 220, a current generation device 230, and a secondary battery 240. All kinds of apparatus that use the secondary battery 240 as a power supply, such as personal computers, mobile phones (smartphones), home appliances, and mobile bodies such as electric bicycles, fall under the category of electronic apparatus 200. The secondary battery 240 is charged when the electronic apparatus 200 is connected via a connection terminal or wirelessly to the charger 400.

The apparatus control device 220 has a first apparatus control element 221, a second apparatus control element 222, and a third apparatus control element 223. Each of the first apparatus control element 221, the second apparatus control element 222, and the third apparatus control element 223 is composed of a processor (arithmetic processing unit), a memory (storage device), an I/O circuit, and the like. The memory or a storage device separate therefrom stores various data such as measurement results of the voltage response characteristics of the secondary battery 240. The apparatus control device 220 works according to the power supplied from the secondary battery 240 and controls the operation of the electronic apparatus 200 in an energized state.

A phrase, each element "recognizes" information, means performing all kinds of arithmetic processing for preparing necessary information such as receiving information, searching for or reading information from the database 10 or other information sources, calculating and estimating information on the basis of other information, and the like.

The operation of the electronic apparatus 200 includes the operations of loads of actuators (such as electric actuators) that constitute the electronic apparatus 200. The processor that is a component of the apparatus control device 220 reads a necessary program and data from the memory and performs arithmetic processing, which is assigned according to the program, on the basis of the data.

The current generation device 230 is composed of, for example, an impulse current generation device. The secondary battery 240 is, for example, a lithium-ion battery and may be another secondary battery such as a nickel metal hydride battery or a nickel cadmium battery. The sensor group 206 measures the voltage response characteristics and temperature of the secondary battery 240, as well as the values of the parameters required to control the electronic apparatus 200. The sensor group 206 includes a voltage sensor, a current sensor, and a temperature sensor that output signals corresponding to the voltage, current, and temperature of the secondary battery 240, respectively, for example.

The battery performance evaluation device 100 may be installed in the electronic apparatus 200. In this case, the software server (not illustrated) may send software for deterioration assessment to the arithmetic processing unit that constitutes the apparatus control device 220 included in the electronic apparatus 200 to give the function of the battery performance evaluation device 100 to the arithmetic processing unit.

(Battery Performance Evaluation Method)

The following describes a battery performance evaluation method of the secondary battery 240 installed in the electronic apparatus 200, which is performed by the battery performance evaluation system of the first embodiment having the above configuration.

Figure 2:
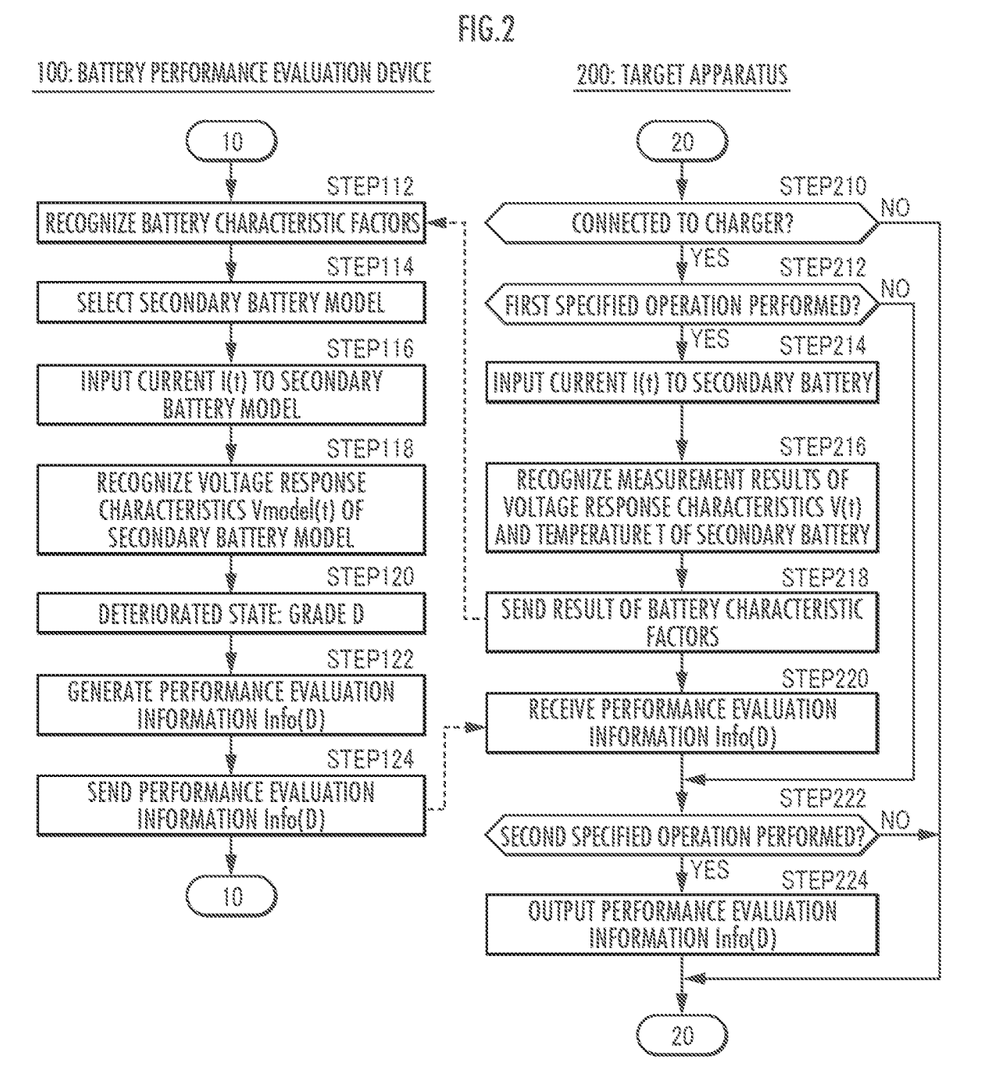
FIG. 2 is a flowchart illustrating a procedure for a battery performance evaluation method.

In the electronic apparatus 200, the first apparatus control element 221 determines whether the electronic apparatus 200 has been connected to the charger 400 (FIG. 2: STEP 210). If the determination result is negative (FIG. 2: STEP 210—NO), it is determined whether the electronic apparatus 200 has been connected to the charger 400 again after the series of processing is completed.

On the other hand, if the determination result is positive (FIG. 2: STEP 210—YES), the first apparatus control element 221 further determines whether a first specified operation has been performed through the input interface 202 (FIG. 2: STEP 212). For example, the "first specified operation" corresponds to an operation for switching the power supply of the electronic apparatus 200 from the ON state to the OFF state, an operation for switching the power supply of the electronic apparatus 200 from the OFF state to the ON state, an operation for deactivating a predetermined application or load that reduces an arithmetic processing load, such as CPU utilization, to a threshold value or lower, or an operation for starting a predetermined application or load.

If the determination result is negative (FIG. 2: STEP 212—NO), a series of processing is completed, and processing from the processing of determining whether the electronic apparatus 200 has been connected to the charger 400 (FIG. 2: STEP 210) is performed.

Figure 3A:
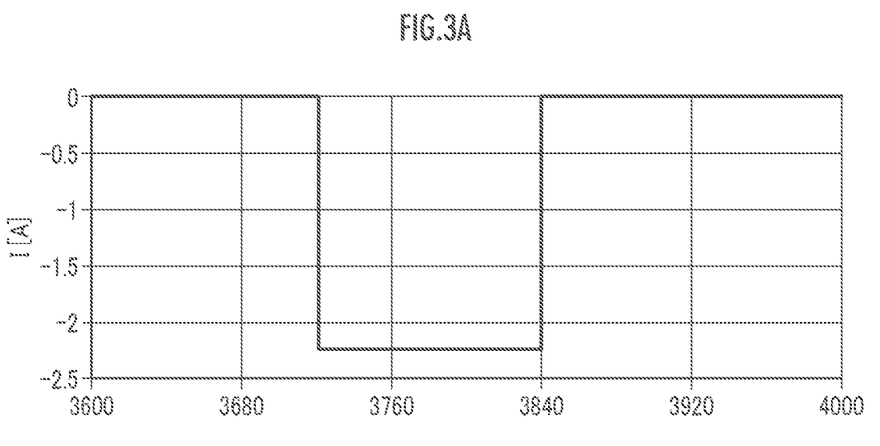
FIG. 3A is an explanatory diagram of an impulse current.

On the other hand, if the first specified operation is determined to have been performed (FIG. 2: STEP 212—YES), the first apparatus control element 221 inputs a current I(t) generated by the current generation device 230 into the secondary battery 240 (FIG. 2: STEP 214). Thereby, for example, the impulse current I(t) as illustrated in FIG. 3A is generated by the current generation device 230 and then input to the secondary battery 240. Depending on the first specified operation, a display device constituting the output interface 204 may display an image or a message such as an icon indicating that the evaluation of the secondary battery 240 is started.

The waveform signal of the impulse current I(t) may be specified by the second control element 120 through mutual communication between the battery performance evaluation device 100 and the electronic apparatus 200. The current generation device 230 is driven while connected to the charger 400, thereby stabilizing the current I(t) input to the secondary battery 240 from the current generation device 230. An auxiliary power supply for generation of impulse current may be installed in the electronic apparatus 200.

At least one of the processing of determining whether the electronic apparatus 200 has been connected to the charger 400 (FIG. 2: STEP 210) and the processing of determining whether the first specified operation has been performed (FIG. 2: STEP 212) may be omitted.

Figure 3B:
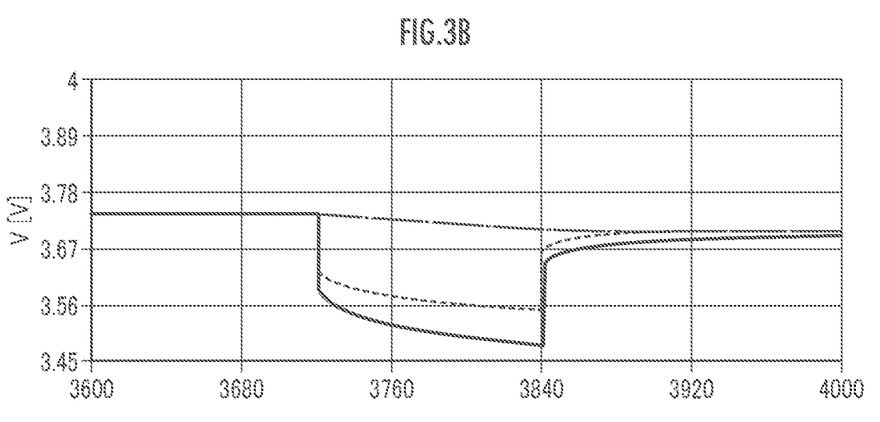
FIG. 3B is an explanatory diagram of voltage response characteristics of a secondary battery and a secondary battery model.

The control device 200 measures the voltage response characteristics V(t) and temperature T of the secondary battery 240 on the basis of the output signals of the sensor group 206 (FIG. 2: STEP 216). Thereby, the voltage response characteristics V(t) of the secondary battery 240, for example, which change as indicated by a solid line in FIG. 3B, are measured.

The first apparatus control element 221 sends battery characteristic factors including the measurement results of the voltage response characteristics V(t) of the secondary battery 240 and the temperature T from the electronic apparatus 200 to the battery performance evaluation device 100 through a communication device constituting the output interface 102 (FIG. 2: STEP 218). The second apparatus control element 222 sends a battery identifier ID for identifying the type (standards, specifications) of the secondary battery 240 included in the battery characteristic factors to the battery performance evaluation device 100. In addition, the battery characteristic factors may include the measurement conditions for determining the impulse current I(t) input to the secondary battery 240 when the voltage response characteristics V(t) are measured.

In the battery performance evaluation device 100, the battery characteristic factors sent from the electronic apparatus 200 are recognized (FIG. 2: STEP 112). Specifically, the first control element 110 recognizes the measurement results of the voltage response characteristics V(t) and the temperature T included in the battery characteristic factors, and the second control element 120 recognizes the battery identifier ID included in the battery characteristic factors.

The second control element 120 selects one secondary battery model associated with each of the battery identifier ID and the measurement result of the temperature T included in the battery characteristic factors, out of many secondary battery models registered in the database 10 (FIG. 2: STEP 114). The secondary battery model is a model dial outputs the voltage value V(t) estimated or predicted to be output from the corresponding secondary battery when the current value I(t) is input. As the secondary battery model, any of various models may be applied, such as, for example, the models described in Japanese Patent Application Laid-Open No. 2008-241246, Japanese Patent Application Laid-Open No. 2010-203935, and Japanese Patent Application Laid-Open No. 2017-138128.

Furthermore, the second control element 120 inputs the current I(t) to the selected secondary battery model (FIG. 2: STEP 116). Thereby, for example, the impulse current I(t) as illustrated in FIG. 3A is input to the secondary battery model. The impulse current I(t) may be recognized on the basis of a waveform signal specified by the second control element 120 or may be recognized on the basis of the measurement conditions information included in the battery characteristic factors sent from the electronic apparatus 200 to the battery performance evaluation device 100.

The second control element 120 calculates the voltage response characteristics $V_{model}(t)$, which is output from the secondary battery model, as an output signal of the secondary battery model (FIG. 2: STEP 118). Thereby, for example, the voltage response characteristics $V_{model}(t)$ of the secondary battery model, which changes as indicated by a broken line in FIG. 3B, is calculated as the output signal of the secondary battery model. In FIG. 3B, a variation mode of an open circuit voltage OCV(t) is indicated by an alternate long and short dash line.

Subsequently, the third control element 130 evaluates the performance of the secondary battery 240 on the basis of a comparison result of the voltage response characteristics V(t) of the secondary battery 240 and the voltage response characteristics $V_{model}(t)$ of the secondary battery model (FIG. 2: STEP 120). For example, a degree of similarity x is calculated, where x is the degree of similarity between a curve representing the voltage response characteristics V(t) of the secondary battery 240 and a curve representing the voltage response characteristics $V_{model}(t)$ of the secondary battery model. Then, a degree of deterioration "D=f(x)" of the secondary battery 240 is calculated according to a decreasing function f with the degree of similarity x as a main variable.

The third control element 130 generates battery performance evaluation information Info(D) according to the degree of deterioration D of the secondary battery 240 (FIG. 2: STEP 122). The third control element 130 sends the battery performance evaluation information Info(D) from the evaluation performance device 100 to the electronic apparatus 200 (FIG. 2: STEP 124).

In the electronic apparatus 200, the battery performance evaluation information Info(D) is received by a communication device that constitutes the input interface 202 (FIG. 2: STEP 220).

Subsequently, the third apparatus control element 222 determines whether the second specified operation has been performed (FIG. 2: STEP 222). For example, the "second specified operation" corresponds to an operation for switching the output interface 204 of the electronic apparatus 200 from the ON state to the OFF state, an operation for switching the output interface 204 of the electronic apparatus 200 from the OFF state (or sleep state) to the ON state (or wake state), an operation for deactivating a predetermined application or load that reduces the arithmetic processing load, such as CPU utilization, to a threshold value or lower, or an operation for starting a predetermined application or load.

If the determination result is negative, (FIG. 2: STEP 222—NO), a series of processing is completed, and the processing from the processing of determining whether the electronic apparatus 200 has been connected to the charger 400 (FIG. 2: STEP 210) is performed. The processing of determining whether the second specified operation has been performed (FIG. 2: STEP 222) may be omitted.

On the other hand, if the second specified operation is determined to be performed (FIG. 2: STEP 222—YES), the third apparatus control element 223 outputs and displays the battery performance evaluation information Info(D) on a display device that constitutes the output interface 204 (FIG. 2: STEP 224). Thereby, the display device displays a graphical display indicating the degree of deterioration D of the secondary battery 240, as well as a message about how to deal with the condition according to the degree of deterioration D, such as "The degree of deterioration of the battery is 30%. We recommend that you replace it in 150 days."

(Method of Building Secondary Battery Model)

The following describes an embodiment of a method of building a secondary battery model registered in the database 10. In this embodiment, there is built a secondary battery model that outputs a voltage value V(t) estimated or predicted to be output from the secondary battery 240 when the current value I(t) is input on the basis of the measurement result of a complex impedance Z of the secondary battery 240.

Figure 4:
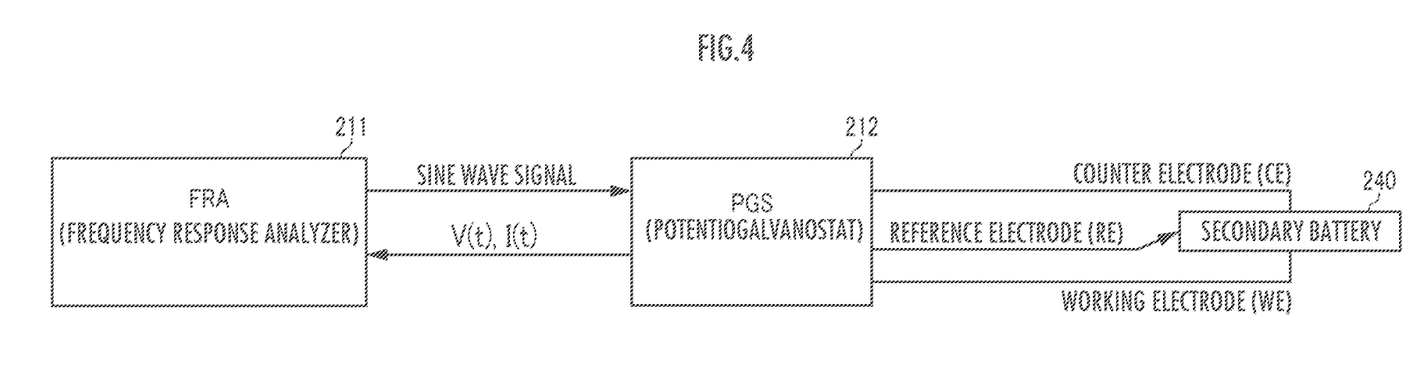
FIG. 4 is an explanatory diagram of a system for measuring the complex impedance of the secondary battery.

The complex impedance Z of the secondary battery 240 that is the target of building the secondary battery model is measured by the AC impedance method. According to the AC impedance method, a combination of a frequency response analyzer (FRA) 211 and a potentiogalvanostat (PGS) 212 is used, as illustrated in FIG. 4. An oscillator constituting the FRA 211 outputs a sine wave signal of an arbitrary frequency, and the current signal I(t) and voltage signal V(t) of the secondary battery 240 corresponding to the sine wave signal are input from the PGS 212 to the FRA 211. Then, in FRA 211, the current signal I(t) and the voltage signal V(t) are converted into data in the frequency domain by the discrete Fourier transform, and the complex impedance Z at the frequency $f=(\omega/2\pi)$ is measured.

For example, the complex impedance Z of the secondary battery 240 may be measured when it is not installed in the electronic apparatus 200, such as immediately before the shipment of the secondary battery 240, and may be stored in the memory or storage device that constitutes the apparatus control device 220 or the first apparatus control element 221. In addition, the complex impedance Z of the secondary battery 240 installed in the electronic apparatus 200 may be measured. In this case, the FRA211 may be composed of the first apparatus control element 221 and the PGS 212 may be composed of the sensor group 206. For example, the electronic apparatus 200 may be connected to an external power supply such as a commercial power supply to charge the secondary battery 240, and a sine wave signal may be output by the power supplied from the external power supply.

Figure 5:
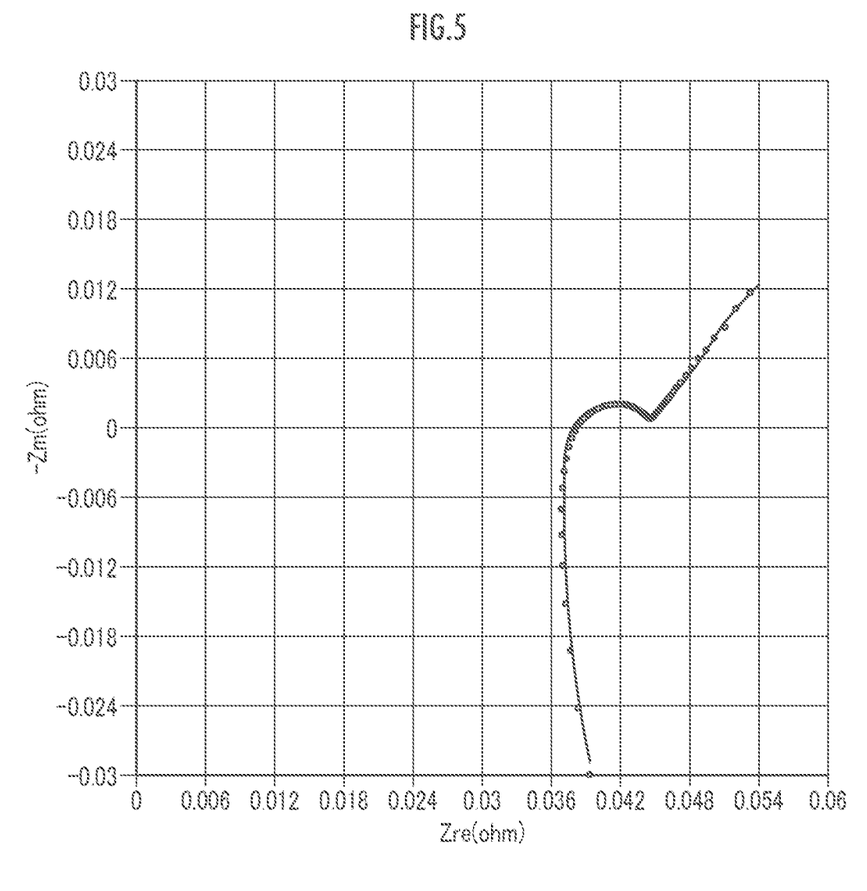
FIG. 5 is an explanatory diagram of a Nyquist plot of the secondary battery.

FIG. 5 illustrates an example of a Nyquist plot representing the measured results of the complex impedance Z of the secondary battery 240, along with an approximate curve of the plot. The horizontal axis represents a real part ReZ of the complex impedance Z, and the vertical axis represents an imaginary part −ImZ of the complex impedance Z. In the region of −ImZ>0, the larger the ReZ, the lower the frequency of the complex impedance Z. The value of ReZ at −ImZ=0 corresponds to a transfer resistance of the secondary battery 240 in an electrolyte solution. The radius of curvature of the approximately semicircular portion in the region of −ImZ>0 corresponds to a charge transfer resistance of the secondary battery 240. The radius of curvature tends to decrease as the temperature T of the secondary battery 240 increases. The linear portion rising at about 45° in the low frequency domain in the −ImZ>0 region reflects the effect of the Warburg impedance of the secondary battery 240.

As described above, the secondary battery model that outputs the voltage value V(t) estimated or predicted to be output from the secondary battery 240 when the current value I(t) is input is defined by a relational expression (01) by using an open circuit voltage OCV(t) of the secondary battery 240 and a transfer function H(z) of the internal resistance.

$$V(t) = OCV(t) + H(t) * I(t) \tag{01}$$

In the above, OCV(t) indicates that the open circuit voltage increases or decreases as the current I(t) is charged and/or discharged.

The transfer function H(t) of the equivalent circuit model of the internal resistance of the secondary battery is defined by a relational expression (02). The transfer function may be connected in series, instead of connected in parallel.

$$H(t) = H_0(t) + \Sigma_{i=1 \sim m} H_i(t) + H_W(t) + H_L(t) \tag{02}$$

"$H_0(t)$," "$H_i(t)$," "$H_W(t)$," and "$H_L(t)$" are defined by parameters that represent the characteristics of the internal resistance of the secondary battery.

Figure 6A:
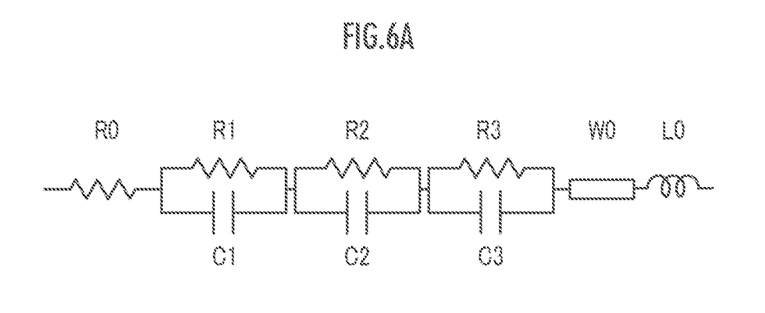
FIG. 6A is a first illustrative explanatory diagram of an equivalent circuit of an internal resistance of the secondary battery.
Figure 6B:
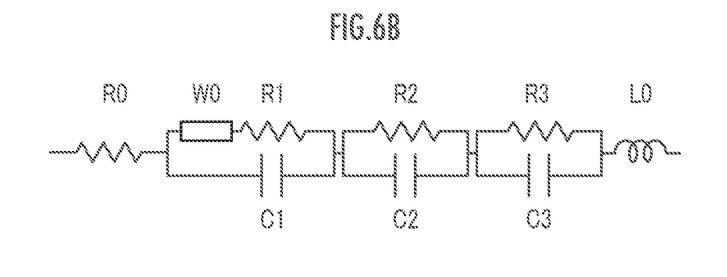
FIG. 6B is a second illustrative explanatory diagram of an equivalent circuit of an internal resistance of the secondary battery.

FIG. 6A illustrates an example of the equivalent circuit of the internal resistance of the secondary battery 240. In this example, the equivalent circuit of the internal resistance is defined by a series circuit of a resistor $R_0$ corresponding to the transfer resistance in an electrolyte solution, the i-th RC parallel circuit (i=1, 2, ... m) composed of a resistor $R_i$ and a capacitor $C_i$ corresponding to the charge transfer resistance, a resistor $W_0$ corresponding to the Warburg impedance, and a coil L. Although the number of RC parallel circuits connected in series is "3" in the embodiment illustrated in FIG. 6A, it may be smaller than 3 or greater than 3. The resistor $W_0$ may be connected in series to the resistor R in at least one RC parallel circuit. The capacitor C may be replaced with a constant phase element (CPE). As illustrated in FIG. 6B, the Warburg resistance W may be connected in series to the resistor R of at least one RC parallel circuit (the first RC parallel circuit in the example of FIG. 6B).

The transfer function $H_0(z)$ of the resistor $R_0$ is defined by a relational expression (031).

$$H_0(z) = R_0 \tag{031}$$

Figure 7A:
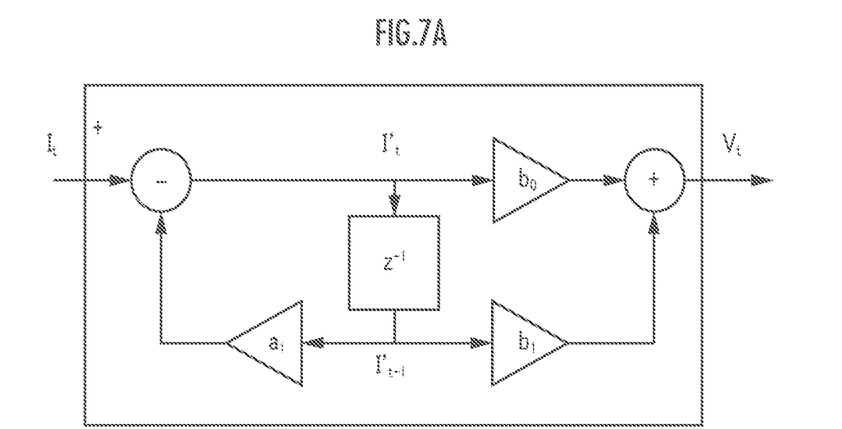
FIG. 7A is a diagram representing a transfer function of an IIR system.

The transfer function $H_i(z)$ of the i-th RC parallel circuit is defined by a relational expression (032) as a transfer function of an infinite impulse response (IIR) system. FIG. 7A illustrates a block diagram representing the transfer function $H_i(z)$ of the i-th RC parallel circuit.

$$H_i(z)=(b_0+b_i z^{-1})/(1+a_i z^{-1}) \quad (032)$$

Figure 7B:
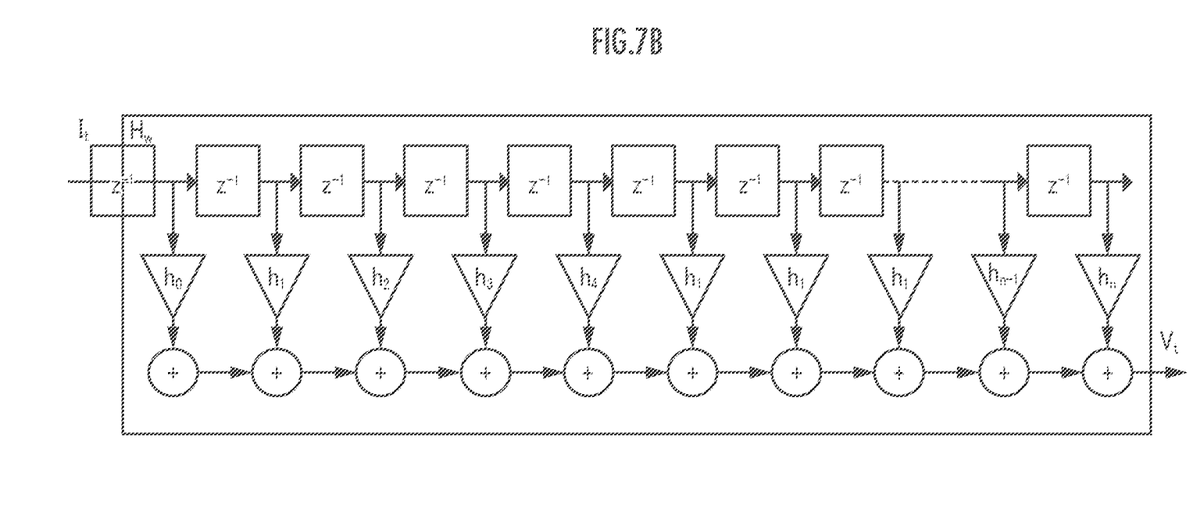
FIG. 7B is a diagram representing a transfer function of an FIR system.

The transfer function $H_W(z)$ of the resistor $W_0$, which corresponds to the Warburg impedance, is defined by a relational expression (04) as a transfer function of a finite impulse response (FIR) system. FIG. 7B illustrates a block diagram representing the transfer function $H_W(z)$ of the resistor $W_0$, which corresponds to the Warburg impedance.

$$H_W(z)=\Sigma_{k=0\sim n} h_k z^{-k} \quad (04)$$

The transfer function $H_L(z)$ of the coil L is defined by a relational expression (05).

$$H_L(z)=(2L_0/T)(1-z^{-1})/(1+z^{-1}) \quad (05)$$

When finding an approximate curve of the complex impedance Z of the secondary battery represented by the Nyquist plot indicated by the solid line in FIG. 5, it is assumed that the transfer function H(z) of the equivalent circuit model of the internal resistance of the secondary battery is defined according to the relational expression (02). Thereby, the values of the parameters $R_0$, $a_i$, $b_0$, $b_i$, $b_k$, $L_0$, and T the obtained (see the relational expressions (031), (032) to (05)). The measurement value of the open circuit voltage OCV identifies the value of the open circuit voltage OCV in the secondary battery model (see relational expression (01)). Then, depending on the values of the parameters, a secondary battery model is built for various types of secondary battery 240.

Second Embodiment (Configuration of Battery Performance Evaluation System)

Figure 8:
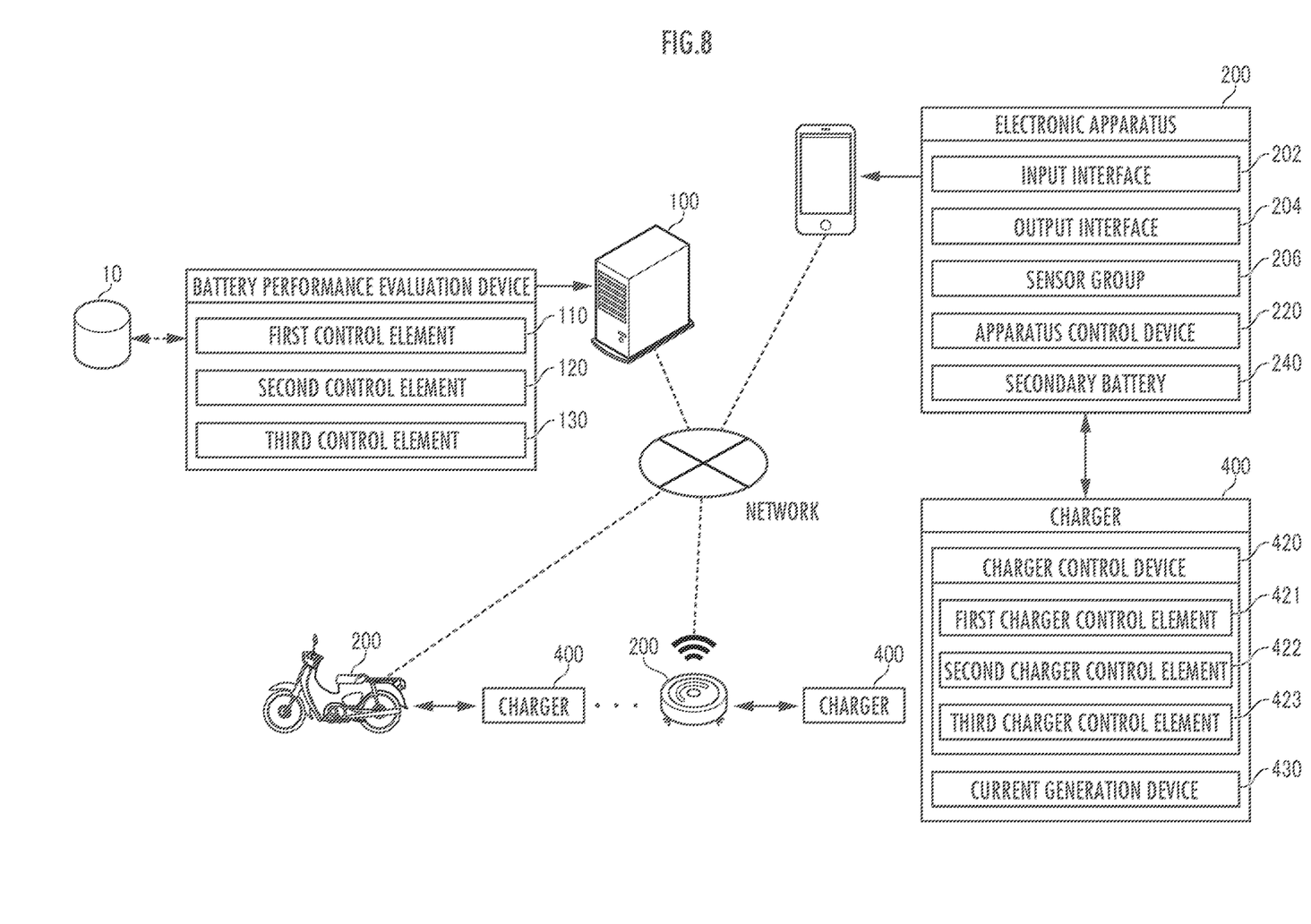
FIG. 8 is an explanatory diagram of the configuration of a battery performance evaluation system as a second embodiment of the present invention.

The battery performance evaluation system as a second embodiment of the present invention illustrated in FIG. 8 includes a battery performance evaluation device 100, an electronic apparatus 200, and a chatter 400. The battery performance evaluation device 100 is capable of mutual communication with the charger 400.

The charger 400 has a charger control device 420 and a current generation device 430. The charger control device 420 has a first charger control element 421, a second charger control element 422, and a third charger control element 423. Each of the first charger control element 421, the second charger control element 422, and the third charger control element 423 is composed of a processor (arithmetic processing unit), a memory (storage device), an I/O circuit, and the like. The memory or a storage device separate therefrom stores various data such as measurement results of the voltage response characteristics of the secondary battery 240. The first charger control element 421, the second charger control element 422, and the third charger control element 423 perform the same functions as of the first apparatus control element 221, the second apparatus control element 222, and the third apparatus control element 223 of the electronic apparatus 200, respectively.

The charger 400 has a current generation device 430, while the electronic apparatus 200 does not have the current generation device 230 (see FIG. 1).

Since the configuration is almost the same as the configuration of the battery performance evaluation system (see FIG. 1) in the first embodiment except the above points, the components are designated by the same reference numerals and the description thereof will be omitted.

(Battery Performance Evaluation Method)

The following describes a battery performance evaluation method of the secondary battery 240 installed in the electronic apparatus 200, which is performed by the battery performance evaluation system of the second embodiment having the above configuration. In the second embodiment, the charger 400 carries out mutual communication with the battery performance evaluation device 100, instead of the electronic apparatus 200, and the performance of the secondary battery 240 is evaluated in the same procedure as in the first embodiment (see FIG. 2).

Specifically, the determination result of whether the first specified operation has been performed that is determined by the first apparatus control element 221 is sent wirelessly or by wire from the electronic apparatus 200 to the charger 400, and the first charger control element 421 recognizes the determination result of whether the first specified operation has been performed (see FIG. 2: STEP 212).

The first charger control element 421 inputs current I(t) to the secondary battery 240 installed in the electronic apparatus 200 wirelessly or by wire by using the current generation device 430 (see FIG. 2: STEP 214).

The first apparatus control element 221 measures the voltage response characteristics V(t) and the temperature T of the secondary battery 240, and then the battery characteristic factors including the measurement results are sent from the electronic apparatus 200 to the charger 400 wirelessly or by wire. Thereby, the first charger control element 421 recognizes the battery characteristic factors (see FIG. 2: STEP 216). Subsequently, the first charger control element 421 sends the battery characteristic factors from the charger 400 to the battery performance evaluation device 100 (see FIG. 2: STEP 218).

The second charger control element 422 recognizes the battery identifier ID via wireless or wired communication with the second apparatus control element 222 and then sends it to the battery performance evaluation device 100 (see FIG. 2: STEP 220).

In the charger 400, the third charger control element 423 receives the battery performance evaluation information Info(D) (see FIG. 2: STEP 220).

Subsequently, the determination result of whether the second specified operation has been performed that is determined by the third apparatus control element 223 is sent wirelessly or by wire from the electronic apparatus 200 to the charger 400, and the third charger control element 423 recognizes the determination result of whether the second specified operation has been performed (See FIG. 2: STEP 222).

If it is determined that the second specified operation has been performed, the third charger control element 423 sends the battery performance evaluation information Info(D) to the third apparatus control element 223 wirelessly or by wire, and the third apparatus control element 223 outputs and displays the battery performance evaluation information Info(D) on the display device constituting the output interface 204 (see FIG. 2: STEP 222—YES→STEP 224).

Other Embodiments of the Present Invention

The functions of the apparatus control device 220 in the first embodiment may be divided between the apparatus control device 200 and the charger control device 400 in the second embodiment.

For example, in the second embodiment, the third apparatus control element 223 receives the battery performance evaluation information Info(D), and then the battery performance evaluation information Info(D) may be output and displayed on the display device constituting the output interface 204 according to the determination result that the second specified operation has been performed (see FIG. 2: STEP 220→STEP 222—YES→STEP 224). In this case, the third charger control element 423 may be omitted.

Further, in the second embodiment, the second apparatus control element 222 may send the battery identifier ID to the battery performance evaluation device 100 (see FIG. 2: STEP 220). In this case, the second charger control element 422 may be omitted.

The secondary battery model has been selected after considering the temperature T of the secondary battery 240 or the electronic apparatus 200 at the time of measuring the voltage response characteristics V(T) to evaluate the performance of the secondary battery 240. As another embodiment, however, the secondary battery model may be selected on the basis of the battery identifier ID representing the type of the secondary battery 240, without considering the temperature T of the secondary battery 240 at the time of measuring the voltage response characteristics V(T), to evaluate the performance of the secondary battery 240.

Advantageous Effect of the Invention

According to the battery performance evaluation device 100 and the battery performance evaluation method performed thereby according to the present invention, a battery performance evaluation device 100 evaluates the performance of a secondary battery 240 installed in an electronic apparatus 200 on the basis of mutual communication between the electronic apparatus 200 and/or a charger 400, to which the electronic apparatus 200 is connected, and the battery performance evaluation device 100. Then, battery performance information Info(D) corresponding to the evaluation result is output to an output interface 204 of the electronic apparatus 200. Thus, a user can ascertain the performance evaluation result of the secondary battery 240 without the need to take the electronic apparatus 200 or the secondary battery 240 to a specialized institution or the like, thereby increasing the convenience tor tin* user of the electronic apparatus 200.

DESCRIPTION OF REFERENCE NUMERALS

10 Database
100 Battery performance evaluation device
110 First control element
120 Second control element
130 Third control element
200 Electronic apparatus
202 Input interface
204 Output interface
206 Sensor group
220 Apparatus control device
221 First apparatus control element
222 Second apparatus control element
223 Third apparatus control element
240 Secondary battery
400 Charger
420 Charger control device
421 First charger control element
422 Second charger control element
423 Third charger control element

The invention claimed is:

1. A battery performance evaluation device for evaluating a performance of a secondary battery installed as a power supply in an electronic apparatus, comprising a first control element, a second control element, and a third control element, wherein:

the second control element specifies a current waveform signal;

the first control element causes a current generation device installed in the electronic apparatus or in a charger to generate the current waveform signal specified by the second control element and to input the current waveform signal into the secondary battery and then recognizes a measured output voltage as a measurement result of a variation mode of a voltage output from the secondary battery, based on communication with the electronic apparatus or the charger, to which the electronic apparatus is connected;

the second control element recognizes a secondary battery model representing current characteristics of the secondary battery based on the communication with the electronic apparatus or the charger and that recognizes a model output voltage as a variation mode of a voltage output from the secondary battery model at the time of input of the specified current waveform signal to the secondary battery model; and the third control element evaluates the performance of the secondary battery based on a comparison result of the measured output voltage recognized by the first control element and the model output voltage recognized by the second control element.

2. The battery performance evaluation device according to claim 1, wherein the first control element recognizes the measured output voltage and the second control element recognizes the model output voltage, with a requirement that a first specified operation has been performed through an input interface of the electronic apparatus.

3. The battery performance evaluation device according to claim 2, wherein the first control element recognizes the measured output voltage and the second control element recognizes the model output voltage, with a requirement that a power-off operation has been performed through the input interface of the electronic apparatus as the first specified operation.

4. The battery performance evaluation device according to claim 1, wherein the first control element recognizes the measured output voltage and the second control element recognizes the model output voltage, with a requirement that the electronic apparatus has been connected to the charger via a connection terminal.

5. The battery performance evaluation device according to claim 4, wherein the first control element recognizes the measured output voltage and the second control element recognizes the model output voltage, with a requirement that the electronic apparatus has been connected to the charger equipped with the current generation device.

6. The battery performance evaluation device according to claim 1, wherein the third control element causes the electronic apparatus to recognize the battery performance evaluation result of the secondary battery based on the communication with the electronic apparatus, so as to output information about the performance of the secondary battery to the output interface of the electronic apparatus.

7. The battery performance evaluation device according to claim 6, wherein the third control element outputs information about the performance of the secondary battery to the output interface based on the communication with the electronic apparatus, with a requirement that a second specified operation has been performed through the input interface of the electronic apparatus.

8. The battery performance evaluation device according to claim 7, wherein the third control element outputs information about the performance of the secondary battery to the output interface based on the communication with the electronic apparatus, with a requirement that a wake-up operation from a sleep state of the output interface has been performed as the second specified operation through the input interface of the electronic apparatus.

9. An electronic apparatus equipped with a secondary battery as a power supply, comprising:
a first apparatus control element that recognizes a current waveform signal specified by a battery performance evaluation device based on communication with the battery performance evaluation device, causes a current generation device installed in or connected to the electronic apparatus to input the specified current waveform signal to the secondary battery, and causes a first control element constituting the battery performance evaluation device to recognize a measured output voltage as a measurement result of a variation mode of a voltage output from the secondary battery according to the specified current waveform signal;
a second apparatus control element that causes a second control element constituting the battery performance evaluation device to recognize a secondary battery model representing current characteristics of the secondary battery based on the communication with the battery performance evaluation device and causes the second control element to recognize the model output voltage as a variation mode of a voltage output from the secondary battery model at the time of input of the specified current waveform signal to the secondary battery model; and
a third apparatus control element that recognizes the performance of the secondary battery evaluated by the battery performance evaluation device based on the communication with the battery performance evaluation device, based on a comparison result of the measured output voltage recognized by the first apparatus control element and the model output voltage recognized by the second apparatus control element, and then outputs information about the performance of the secondary battery to the output interface.

10. A charger to which an electronic apparatus equipped with a secondary battery is connected as a power supply, comprising:
a current generation device;
a first charger control element that recognizes a current waveform signal specified by a battery performance evaluation device based on communication with the battery performance evaluation device, causes the current generation device to input the specified current waveform signal to the secondary battery of the electronic apparatus connected to the charger, and causes a first control element constituting the battery performance evaluation device to recognize a measured output voltage as a measurement result of a variation mode of a voltage output from the secondary battery according to the specified current waveform signal;
a second charger control element that causes a second control element constituting the battery performance evaluation device to recognize a secondary battery model representing current characteristics of the secondary battery based on the communication with the battery performance evaluation device and that causes the second control element to recognize a model output voltage as a variation mode of a voltage output from the secondary battery model at the time of input of the specified current waveform signal to the secondary battery model; and
a third charger control element that recognizes the performance of the secondary battery evaluated by the battery performance evaluation device based on the communication with the battery performance evaluation device, based on a comparison result of the measured output voltage recognized by the first control element and the model output voltage recognized by the second control element, and then outputs information about the performance of the secondary battery to the output interface of the electronic apparatus.

11. A battery performance evaluation method of evaluating a performance of a secondary battery installed as a power supply in an electronic apparatus, comprising a first control step, a second control step, and a third control step, wherein:
the second control step includes a step of specifying a current waveform signal;
the first control step includes a step of causing a current generation device installed in the electronic apparatus or in a charger to generate the current waveform signal specified in the second control step and to input the current waveform signal into the secondary battery and then recognizing a measured output voltage as a measurement result of a variation mode of a voltage output from the secondary battery, based on communication with the electronic apparatus or the charger, to which the electronic apparatus is connected;
the second control step includes a step of recognizing a secondary battery model representing current characteristics of the secondary battery based on the communication with the electronic apparatus or the charger and recognizing a model output voltage as a variation mode of the voltage output from the secondary battery model at the time of input of the specified current waveform signal to the secondary battery model; and
the third control step includes a step of evaluating the performance of the secondary battery based on a comparison result of the measured output voltage recognized in the first control step and the model output voltage recognized in the second control step.

* * * * *